United States Patent
Liebeke et al.

(10) Patent No.: US 6,918,175 B1
(45) Date of Patent: Jul. 19, 2005

(54) SUPPLY MODULE FOR FEEDING ELECTRICAL COMPONENTS TO AN AUTOMATIC PLACEMENT DEVICE

(75) Inventors: Thomas Liebeke, München (DE); Johann Melf, Münsing (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/647,089

(22) PCT Filed: Mar. 25, 1999

(86) PCT No.: PCT/DE98/00896
§ 371 (c)(1),
(2), (4) Date: Sep. 26, 2000

(87) PCT Pub. No.: WO99/49714
PCT Pub. Date: Sep. 30, 1999

(30) Foreign Application Priority Data
Mar. 26, 1998 (DE) .............................. 198 13 500

(51) Int. Cl.[7] .............................................. B23P 19/00
(52) U.S. Cl. ........................... 29/740; 29/741; 29/771; 29/759; 29/720; 414/403; 414/416.05; 226/151; 226/115
(58) Field of Search ......................... 29/740, 771, 741, 29/832, 563, 564.3, 564.1, 335, 759; 414/403, 414/798.69, 416.07, 416.03, 411, 416.1, 416.08; 221/211, 81; 156/584; 226/139, 8, 109, 115, 226/145, 151; 242/538

(56) References Cited

U.S. PATENT DOCUMENTS

| | | | | |
|---|---|---|---|---|
| 4,440,355 A | * | 4/1984 | Mori et al. | 242/55 |
| 4,494,902 A | * | 1/1985 | Kuppens et al. | 414/223 |
| 4,687,152 A | * | 8/1987 | Hawkswell | 242/55 |
| 4,869,393 A | * | 9/1989 | Soth | 221/1 |
| 5,020,959 A | * | 6/1991 | Soth | 29/759 |
| 5,299,902 A | * | 4/1994 | Fujiwara et al. | 414/416 |
| 5,419,802 A | * | 5/1995 | Nakatsuka et al. | 156/584 |
| 5,605,430 A | * | 2/1997 | Legrady | 414/412 |
| 6,178,620 B1 | * | 1/2001 | Yoshida et al. | 29/740 |

FOREIGN PATENT DOCUMENTS

EP 0 460 834 A1 12/1991

* cited by examiner

Primary Examiner—Minh Trinh
(74) Attorney, Agent, or Firm—Schiff Hardin LLP

(57) ABSTRACT

A supply module for feeding electrical components to an automatic component-mounting machine has a locking element which is a piezoceramic bending transducer that extends in the longitudinal direction of the supply module along a supply path for the components. A free end of the locking element projects into a window of the supply module to an extent such that the locking element is located slightly above the component which has been conveyed there and is ready for removal. By applying an operating voltage to the locking element, the locking element can be deflected laterally to an extent such that it is moved out of the coverage region over the component transversely with respect to the component advancing direction.

3 Claims, 1 Drawing Sheet

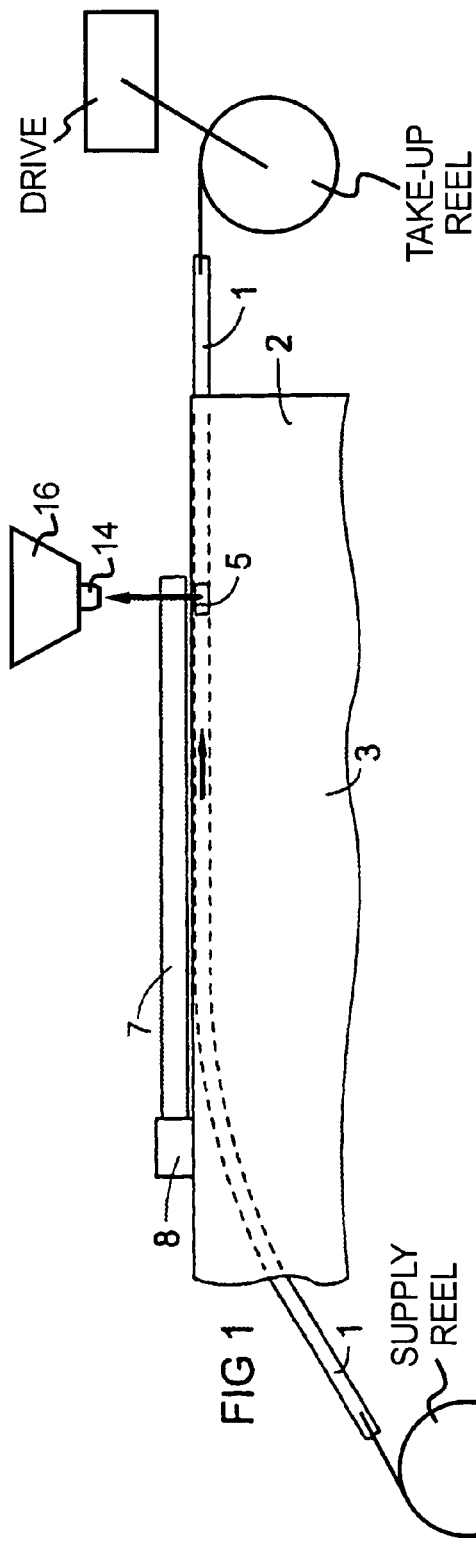
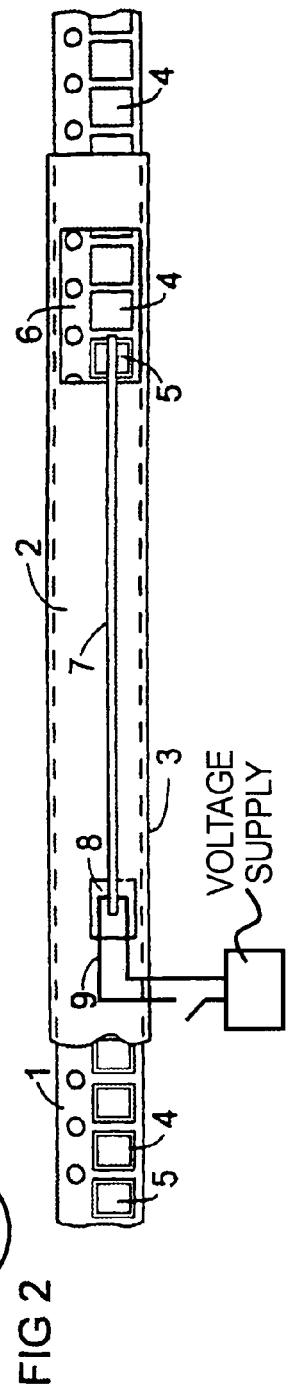
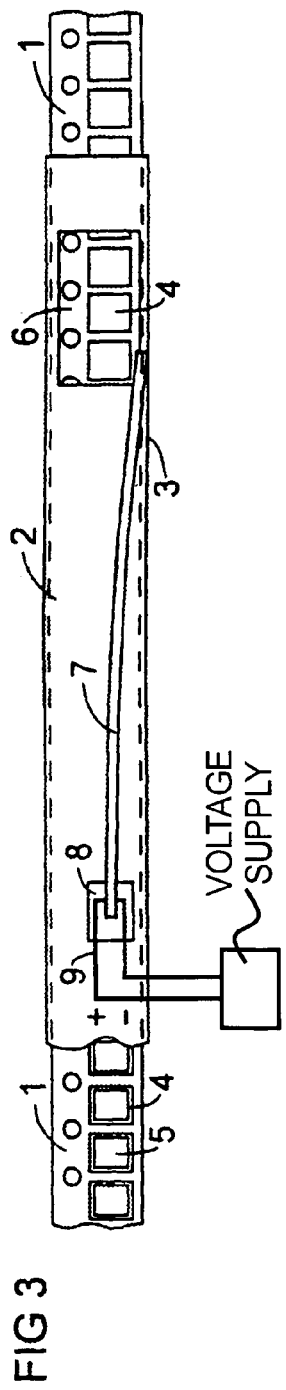
FIG 1
FIG 2
FIG 3

SUPPLY MODULE FOR FEEDING ELECTRICAL COMPONENTS TO AN AUTOMATIC PLACEMENT DEVICE

BACKGROUND OF THE INVENTION

1. Field of the Invention

The present invention relates to a supply module for feeding electrical components to an automatic component-mounting machine.

2. Description of the Related Art

A module of this type has been disclosed e.g. by European patent document EP 0 460 834 A1, according to which the components are stored in a carrier belt that is drawn progressively through the module. In this case, the components are conveyed to a collection position under a slide which can be moved in the advancing direction. In order to prevent the components from jumping out upon jerky advancing of the belt, the slide initially covers the collection position, and releases it upon the approach of a removal tool of the automatic component-mounting machine, so that the component can be removed e.g. by means of a suction pipette. The slide is actuated by means of a lever mechanism coupled to a drive for the component belt, the slide excursion being equal to the pitch of the component belt.

Supply modules of this type are kept as narrow as possible so that the largest possible number can be arranged in the access region of the component-mounting tool. Components of different lengths can be accommodated in component belts of the same width. The belt advancing is designed such that the advancing length can be matched to the different pitches of the belt. The slide excursion must be kept large enough that even the longest components can be reliably covered.

SUMMARY OF THE INVENTION

The present invention is based on the object of simplifying the supply module with regard to the securing and release of the components. This object is achieved by means of the invention in a supply module for feeding electrical components to an automatic component-mounting machine, in which case the components can be displaced in the supply module into a collection position from which they can be removed by a component-mounting head of the automatic component-mounting machine and can be placed onto a component carrier to be populated, a removal side of the collection position can be blocked by means of an adjustable locking element that covers the supplied component at least partially in a blocking position and that releases the component in a removal position, the locking element is designed as a strip extending in the advancing direction, the width of which strip is less than the lateral distance between the component and an adjacent exterior side of the supply module, the exterior side extending in the advancing direction and being perpendicular to the advancing plane, and the locking element can be moved transversely with respect to the advancing direction into the edge region between the component and the exterior side.

The maximum length of the components oriented in the advancing direction is considerably larger than the maximum width. The transversally deflectable locking element thus requires a smaller excursion which, moreover, may be independent of the dimensions of the component. As a result, the actuating mechanism of the locking element can be designed considerably more simply. In the case of wide components, in particular, it is possible that the locking element is narrower than the components. It is therefore advantageous if the locking element covers the center of the components at a short distance in the blocking position, in order to reliably impede the component on emplacement.

Advantageous developments of the invention are provided by the locking element being designed as a narrow finger projecting in the advancing direction, the free end of which finger forming the strip and projecting into the removal region of the component in the blocking position, and the free end being movable into the edge region by lateral deflection. In a preferred embodiment, the finger is designed as a freely projecting bending spring which is anchored by its non-free end on a fixed bearing of the supply module. In one embodiment, the bending spring is designed as an electrically actuable bending transducer, in particular of piezoceramic.

The finger can, for example, be mounted pivotably at its other end and be held in its blocking position by a torsion spring. A particular advantage is that the locking element can be arranged and mounted completely above the component belt. The finger can be laterally deflected e.g. by means of a simple plunger having a small excursion.

A further development simplifies the locking even more. The bending spring located edgewise above the component belt can easily be deflected laterally but is sufficiently stiff in the direction perpendicular to the belt plane to absorb the small emplacement forces of the components. The locking element is anchored on the supply module only at its non-free end and requires no additionally support or guidance, whatsoever.

Another development combines the drive and blocking functions of the locking element in one structural part which can be actuated simply by applying an electric voltage. Such bending transducers can be acquired inexpensively in suitable dimensions. The mechanical outlay is limited to the fixed clamping point on the supply module and to the connection of an electrical line to the electrical potentials present in the supply module.

BRIEF DESCRIPTION OF THE DRAWINGS

The present invention is explained in more detail below using an exemplary embodiment which is illustrated in the drawings.

FIG. 1 shows a diagrammatic side view of a supply module for feeding electrical components to an automatic component-mounting machine, FIG. 2 shows a plan view of the supply module according to FIG. 1 with a locking element located in the blocking position, FIG. 3 shows the supply module according to FIG. 2 with the locking element in an open position.

DETAILED DESCRIPTION OF THE PREFERRED EMBODIMENTS

According to FIGS. 1 and 2, a component belt 1 unwound from a reel 10 is guided through a supply module 2 at a short distance from an exterior side 3 of the supply module 2 in accordance with the dashed lines, the exterior side 3 extending in the longitudinal direction of the component belt 1 and perpendicularly to the plane thereof.

The component belt 1 has pockets 4 strung closely together in its longitudinal direction and serving for accommodating electrical components 5 that are to be supplied. The component belt 1 is drawn progressively through the supply module 2 in accordance with the pitch spacing of the pockets 4 by means of a drive 12. In this case, the components 5 pass under a window 6—open to the top—of the supply module 1, where they can be gripped by a suction pipette of a component-mounting head 16 for populating printed circuit boards and be lifted out in accordance with the arrow 18 perpendicular to the component belt 1 in FIG. 1. The advancing direction of the component belt 1 is indicated by the horizontal arrow 20.

There is arranged above the supply path of the component belt 1 a locking element 7 after the manner of a leaf spring clamped at one end, which spring extends in the central plane of the components 5 along the supply path and the material plane of which spring is perpendicular to the plane of the component belt 1. The free end of the locking element 7 projects from the supply direction into the window 6 to an extent such that it is located centrally above the component 5 which is situated therein and which is ready for removal. As a result, this exposed component 5 is prevented from changing its collection position upon jerky advancing of the component belt 1. The locking element 7 is designed as a piezoelectric bending transducer whose other end is clamped in a fixed bearing 8 of the supply module 2. The locking element 7 extends rectilinearly in the inactivated state.

In the region of the fixed bearing 8, electrical lines 9 are connected to the piezoceramic locking element 7 from a control 22. When a voltage is applied by the control 22, the locking element 7 is deflected laterally as shown in FIG. 3 to an extent such that it releases the component 5 which is ready for removal, which component is then lifted out of the pocket 4 of the component belt 1 in accordance with the vertical arrow in FIG. 1. The applied voltage is then switched off, whereupon the locking element 7 springs back to its starting position and projects above the subsequent component.

Although other modifications and changes may be suggested by those skilled in the art, it is the intention of the inventors to embody within the patent warranted hereon all changes and modifications as reasonably and properly come within the scope of their contribution to the art.

We claim:

1. A supply module for feeding electrical components to an automatic component-mounting machine having a component-mounting head, comprising:

a component displacement apparatus operable to displace the electrical components in an advancing direction along an advancing plane to a removal position, said removal position being configured to permit the components to be removed by the component-mounting head of the automatic component-mounting machine, said component displacement apparatus defining a removal opening at said removal position, the component-mounting head removing the electrical components through said removal opening;

an adjustable locking element that at least partially blocks the electrical component at the removal opening when said adjustable locking element is in a blocking position and that releases the electrical component at the removal opening when said adjustable locking element is in a removal position, said adjustable locking element including a strip extending in the advancing direction, said strip having a width of less than a lateral distance between the electrical component at the removal opening and an adjacent exterior side of the component displacement apparatus, said adjacent exterior side extending in the advancing direction and being perpendicular to the advancing plane, said adjustable locking element being electrically actuated to selectively move transversally with respect to the advancing direction into an edge region between the electrical component at the removal position and the exterior side, wherein said adjustable locking element is a narrow finger projecting in the advancing direction, said narrow finger having a free end forming the strip and projecting into the removal position over the electrical component in the blocking position, and said free end being movable into the edge region by lateral deflection, and wherein said narrow finger is a single freely projecting bending spring, said freely projecting spring having a non-free end and being anchored by said non-free end on a fixed bearing of the component displacement apparatus.

2. The supply module as claimed in claim 1, wherein said freely projecting bending spring is an electrically actuable bending transducer.

3. The supply module as claimed in claim 2, wherein said electrically actuable bending transducer is of piezoceramic material.

* * * * *